United States Patent [19]

Koch

[11] Patent Number: 4,595,819

[45] Date of Patent: Jun. 17, 1986

[54] METHOD AND SYSTEM FOR DEFLECTING A FOCUSSED ELECTRON BEAM ALONG A PREDETERMINED PROCESSING PATH

[75] Inventor: Dieter Koch, Stuttgart, Fed. Rep. of Germany

[73] Assignee: Institut für Kerntechnik und Energiewandlung e.V., Stuttgart, Fed. Rep. of Germany

[21] Appl. No.: 551,871

[22] Filed: Nov. 15, 1983

[30] Foreign Application Priority Data

Nov. 22, 1982 [DE] Fed. Rep. of Germany ....... 3243033

[51] Int. Cl.$^4$ ............................................. B23K 15/00
[52] U.S. Cl. ..................... 219/121 EB; 219/121 EM; 219/121 ED; 219/121 EU; 250/491.1
[58] Field of Search ................. 219/121 EB, 121 EM, 219/121 EU, 121 EV, 121 EW, 121 EA, 121 ER, 121 ES, 121 EC, 121 ED; 250/492.2, 492.1

[56] References Cited

U.S. PATENT DOCUMENTS

| 3,513,285 | 5/1970 | Imura ........................... | 219/121 EW |
| 3,519,788 | 7/1970 | Hatzakis ....................... | 219/121 EW |
| 4,390,788 | 6/1983 | Hayashi et al. .................. | 250/492.2 |
| 4,442,361 | 4/1984 | Zasio ............................. | 250/492.2 |

*Primary Examiner*—M. H. Paschall
*Attorney, Agent, or Firm*—Erwin S. Teltscher

[57] ABSTRACT

The two dimensional processing path along which the electron beam of a welder is to be deflected during a processing cycle is approximated by a sequence of points separated by predetermined distances from one another. The deflection signals for the beam are derived from analog signals having levels corresponding to the points, and interpolation there between. The rate of interpolation depends on the distance between the points and time intervals specified so as to create preselected beam velocities. Since a weld is improved when there is micromotion of the beam around the processing, a modulation path generator is also provided. Since the coordinates furnished by this modulation path generator are in a fixed coordinate system and the micromotion of the beam is relative to the processing path, a coordinate rotation is carried out before the modulation signals are superimposed upon the processing path deflection signals. For increased accuracy, the movement of the beam is controlled by a closed loop system in which the actual position of the gap to be welded is determined in a separate cycle, compared to the desired position and a corresponding error signal generated and stored. A correction signal corresponding to the error signal is then added onto the modulation signals prior to coordinate rotation in the next processing cycle.

25 Claims, 4 Drawing Figures

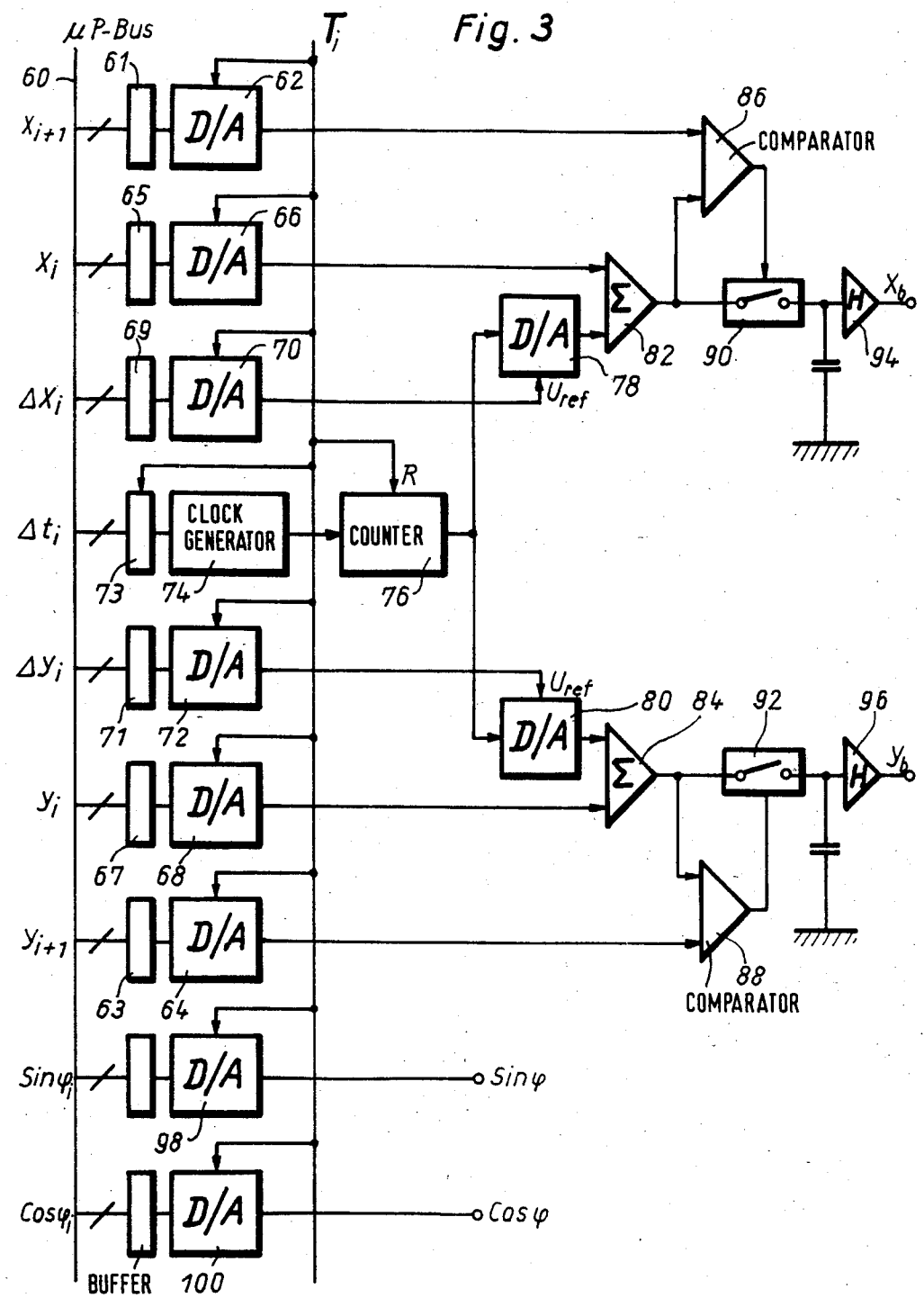

METHOD AND SYSTEM FOR DEFLECTING A FOCUSSED ELECTRON BEAM ALONG A PREDETERMINED PROCESSING PATH

CROSS REFERENCE TO RELATED APPLICATIONS AND PUBLICATIONS:

German Pat. No. 30 43 635.
Application Ser. No. 518 351.
Filed July 29, 1983, and assigned to the same assignee.
The above are hereby incorporated by reference into the present application.

FIELD OF THE INVENTION

The present invention relates to a method and system for processing workpieces by means of a focussed electron beam. In particular, operations such as welding, heating, and remelting of the workpiece are contemplated.

BACKGROUND OF THE INVENTION

In conventional systems of this type, the processing path is approximated by the output of one or more function generators. These function generators generate only analytic curves such as straight lines, circles, parabolas, etc. Relatively simple figures, such as rectangles with rounded corners may be formed by a combination of such outputs. The relatively complicated processing paths which appear very frequently in practice cannot be approximated in this way. The only available alternative is then manual operation or a numerical control system.

SUMMARY OF THE INVENTION

It is an object of the present invention to develop a method and system for generating arbitrary processing paths with high accuracy and reproducibility.

According to the present invention, a workpiece is processed by means of a focussed electron beam impinging on the workpiece along a predetermined processing path. The processing path is approximated by a sequence of points at predetermined distances from one another. The electron beam is moved between respective sequential ones of the points along respective connecting paths at respective preselected velocities. This allows arbitrary path configurations to be generated. The points need not be evenly spaced, but can be closer together where the processing path has relatively complicated curvatures, while simpler sections allow a less dense distribution. For example, a complete circle can be generated using only 16 points and still achieve a radial accuracy within 1%.

In addition to its deflection along the processing path, the electron beam may be deflected along a modulation path superimposed on the processing path. During a welding process, such a micromotion of the electron beam can change the dynamics of the capillary action and thereby substantially influence the structure of the weld.

If the deflection of the beam is to be controlled by a closed loop or feedback control, a deflection of the beam in a direction normal to the processing path is also required to allow generation of a deviation signal (error signal) signifying the difference between the actual position of the welding gap and the predetermined processing path. This is disclosed in German Pat. No. 30 43 635.

This patent discloses that in a method and an apparatus for automatic welding of a workpiece by means of a focussed electron beam along a welding gap, and wherein at first the position of the welding gap is measured with reference to a predetermined null line by movement of a focussed scanning beam, particularly of an electron beam, at a certain velocity, and substantially transverse to the welding gap, and by intercepting the scanning beam reflected from the workpiece, and wherein positional data obtained by electronic evaluation of the signals generated by the welding gap are stored, and wherein the workpiece is further moved past the impingement point of the electron beam during the subsequent welding process along the welding gap, the impingement point having been corrected positionally by means of the stored position data, the improvement comprises forming the stored position data by taking the average value of a plurality of individual measurements, and wherein the scanning beam is moved within a predetermined path along the welding gap past locations spaced from one another by a distance, and approximately transverse to the welding gap.

The modulation paths are always specified in a fixed coordinate system. They may be analytically created or read out of a data storage. In accordance with one embodiment of the present invention, the direction of the connecting path to the next subsequent point is either precomputed or computed at each point, thereby allowing the modulation path to be rotated to maintain the same position relative to the processing path at each of the points.

In a further preferred embodiment of the present invention, the equipment operates in two cycles: In the processing cycle, the actual processing of the workpiece, such as welding, is carried out. In the measuring cycle, the beam is oscillated along a line perpendicular to the processing path, thus allowing generation of a position signal indicative of the actual position of the gap to be welded. The deviation of this position from the desired processing path is then computed and stored, and a corresponding correction is additively superimposed on the coordinates of the processing path at each point.

The novel features which are considered as characteristic for the invention are set forth in particular in the appended claims. The invention itself, however, both as to its constrution and its method of operation, together with additional objects and advantages thereof will best be understood from the following description of specific embodiments when read in connection with the accompanying drawing.

BRIEF DESCRIPTION OF THE DRAWING

FIG. 3 is a schematic block diagram of a second embodiment of a processing path approximation generator and FIG. 4 is a typical path traced by the electron beam of the beam welder, inclusive of the modulation path.

DESCRIPTION OF THE PREFERRED EMBODIMENTS

Figure 1:
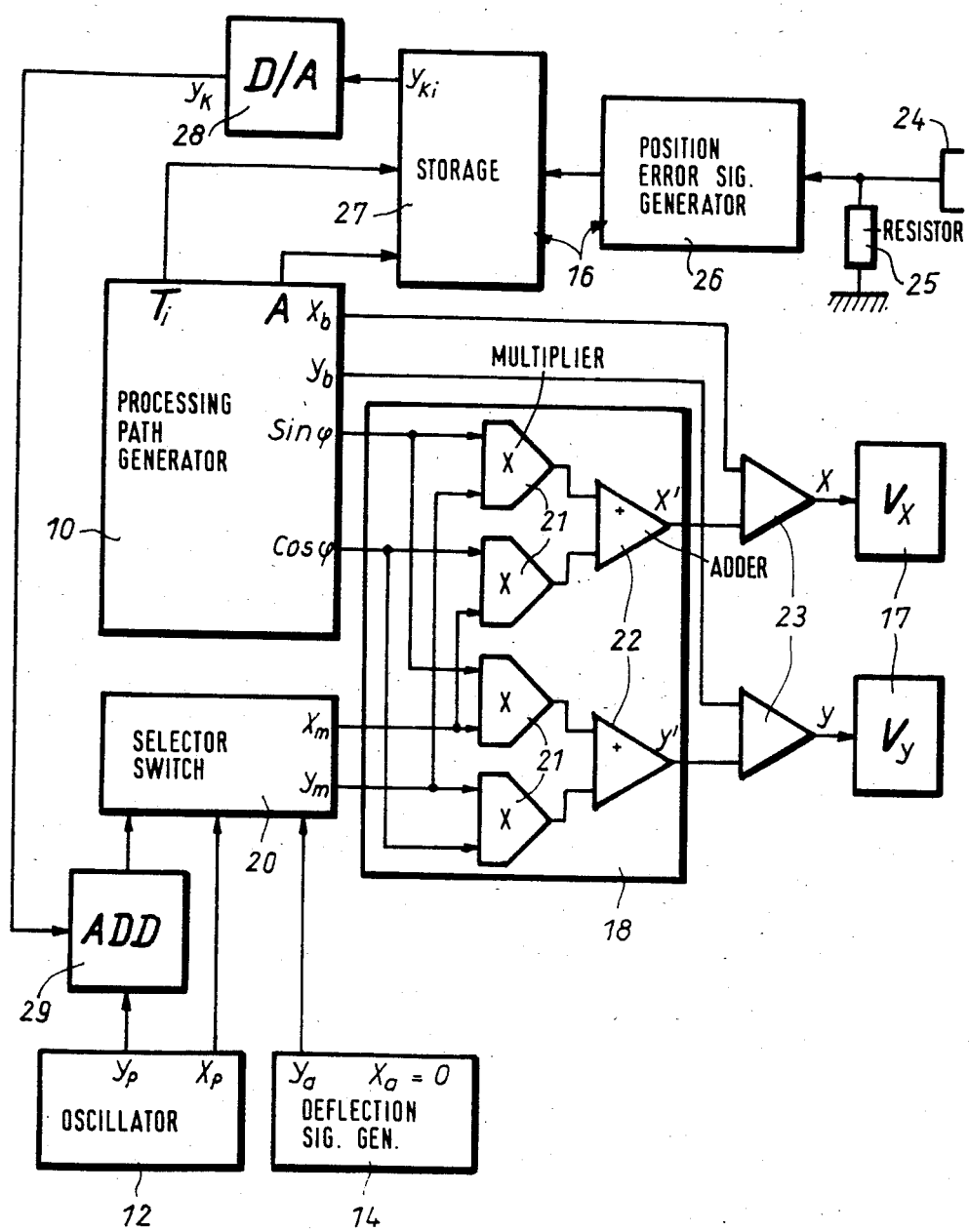
FIG. 1 is a schematic block diagram of a circuit for controlling the deflection amplifiers of an electron beam welder.

The block diagram of FIG. 1 shows a processing path approximation generator 10 and a modulation path approximation generator which consists of an oscillator 12 used during the processing cycle and a deflection signal generator 14 used during the measuring cycle. Further illustrated is a feedback system 16 for controlling the electron beam, and a circuit block 18 used to combine the analog output signals of generator 10 with the output of either oscillator 12 or deflection generator 14, as selected by a selector switch circuit 20. Circuit block 18 further receives inputs from feedback system 16. The outputs of circuit block 18 are applied to the inputs of deflection amplifiers 17 of an electron beam welder.

For simplification, all of the digital coordinates and direction values of the processing path and the modulation path are denoted by the same letters as the associated analog signals (voltages) throughout this specification.

Use of the processing path approximation generator 10 allows the electron beam to be deflected with a selectable velocity along a two dimensional predetermined processing path. The required modulation path, during either the processing or the measuring cycle, is superimposed by adding the output of either oscillator 12 or deflection generator 14, respectively. The electron beam is then deflected in a micromotion relative to the processing path. The modulation path coordinates $(x_p, y_p)$ or $(x_a=0, y_a)$ at the output of the selector switch 20 are associated with a fixed coordinate system. A coordinate rotation is therefore carried out in block 18. This coordinate rotation causes the modulation path coordinates to be rotated in the direction of the normal (or tangent) to the processing path before being superimposed on the latter. In order to allow this coordinate rotation to be carried out, the signals $\sin \phi$ and $\cos \phi$ are furnished at the output of generator 10 in addition to the instantaneous coordinate signals $x_b$, $y_b$. Angle $\phi$ is the angle signifying the direction of the normal to the processing path relative to the x-axis of the fixed coordinate system. The modulation path coordinates $x_p$, $y_p$, or $x_a=0$, $y_a$, available at the output of selector switch 20, are connected in pairs, together with direction signals $\sin \phi$ and $\cos \phi$, to the inputs of four analog multipliers 21. The outputs of multipliers 21 are connected to adders 22 for coordinate rotation in accordance with the following relationships:

$$x' = x_m \cos \phi - y_m \sin \phi$$

$$y' = x_m \sin \phi + y_m \cos \phi$$

Here x' and y' are the coordinates resulting from rotation.

If instead of angle $\phi$, which signifies the direction of the normal to the processing path relative to the x axis of the fixed coordinate system as stated above, the angle of the tangent to the processing curve is used, the coordinate rotation in circuit block 18 will take place according to these relationships:

$$x' = -x_m \sin \psi + y_m \cos \psi$$

$$y' = x_m \cos \psi + y_m \sin \psi$$

Again, x' and y' are the rotated coordinates.

The outputs signals resulting from the coordinate rotation are then applied to one input each of analog adders 23. The other input of each of the adders receives the associated processing path coordinates $x_b$ and $y_b$. The output of adders 23 is applied to the respective deflection amplifiers 17 of the electron beam welder. In practice, each pair of adders 22, 23, can be combined to a single adder having three analog inputs.

Figure 2:
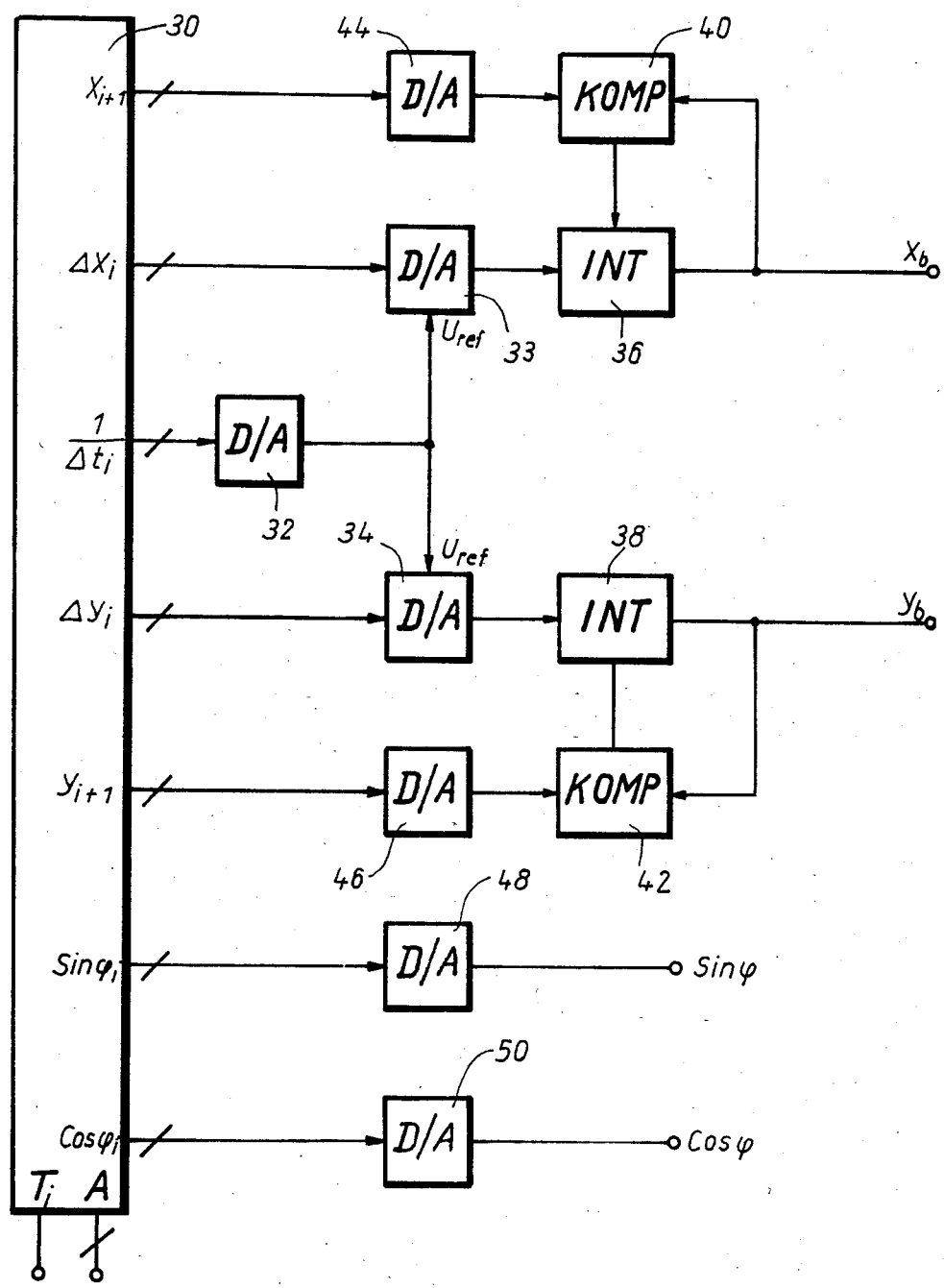
FIG. 2 is a schematic block diagram of a first embodiment of a processing path approximation generator.

As mentioned previously, an approximation to the desired processing path is generated in generator 10 by interpolation between points spaced at predetermed distances from one another. As will be explained in greater detail below, the interpolation is carried out in such a way that the electron beam is deflected from point to point at preselected velocities. Different embodiments of processing path approximation generators are illustrated in FIGS. 2 and 3. Each has an input block (30, 60) in which the various parameters required for the interpolation are either read from a digital storage, or computed, preferably by a microprocessor.

In the embodiment illustrated in FIG. 2, approximation generator 10 includes a block 30 which generates the following values at time $t_i$ at which the beam is at the point having coordinates $x_i$, $y_i$:

The coordinates $x_i+1$, $y_i+1$ of the next subsequent point; the differences between the two coordinate values, $\Delta x_i$, $\Delta y_i$; and $1/\Delta t_i$ a value which is inversely proportional to the preselected time interval $\Delta t_i$ in which the beam is to pass from the first to the second point.

This signal $1/\Delta t_i$ is converted to an analog signal in D/A converter 32. The analog signals constitute reference voltages for multiplying D/A converter 33, 34, to the digital inputs of which the difference values $\Delta x_i$, $\Delta y_i$, respectively are applied. The output signals of D/A converter 33, 34 are therefore proportional to $\Delta x_i/\Delta t_i$ and $\Delta y_i/\Delta t_i$, respectively. The output signals of D/A converter 33, 34 are integrated linearly with respect to time in integrator 36, 38, starting with the lower boundary value of $x_i$ and $y_i$, respectively. The output of integrators 36, 38 is therefore a voltage which varies linearly with respect to time.

Comparators 40 and 42 compare the output signals of integrators 36 and 38, respectively, to the output signals of D/A converters 44 and 46. The latter output signals are proportional to coordinates $x_{i+1}$ and $y_{i+1}$, respectively. As soon as the so-compared voltages are identical, integrators 36 and 38 are disconnected from their inputs and act as holding circuits maintaining the then-present output voltage. Interpolation signals for the approximation of the processing path are available at the outputs of integrators 36 and 38.

At each approximation point, unit 30 further furnishes the sine and cosine value of angle $\psi_i$, i.e., the angle which the normal of the processing path makes with x axis of the associated coordinate system at time $t_i$. These signals are converted into the corresponding analog signals in D/A converters 48 and 50. The analog signals are available at the output of processing path approximation generator 10.

In the embodiment of a processing path approximation generator 10 illustrated in FIG. 3, a microprocessor controlled unit 60 supplies the coordinate values $x_{i+1}$, $y_{i+1}$ which are to be reached at time $t_{i+1}$ to D/A converters 62 and 64; the coordinate values $x_i$, $y_i$ which should be present at $t_i$ to D/A converters 66, 68; and the difference of the coordinate values, $\Delta x_i$, $\Delta y_i$ to D/A converters 70 and 72, respectively. These transmissions take place at time $t_i$ and each value supplied by unit 60 is transmitted through an associated buffer storage 61, 63, 65, 67, 69, and 71. There is an additional digital buffer storage 73 which receives a signal signifying time interval $\Delta t_i$. The latter controls the frequency of a clock generator 74 so that n clock pulses are generated in time interval $\Delta t_i$.

A signal $T_i$ timing the entry of numbers into the D/A converters also resets to zero a counter 76 whose counting input receives the output of clock generator 74. The output of counter 76 is connected to two multiplying D/A converters 78, 80, whose reference voltages are furnished by D/A converters 70, 72, respectively. Each count thus increases the output voltages of D/A converters 78 and 80 by $1/n \cdot \Delta x_i$ and $1/n \cdot \Delta y_i$, respectively. After n counts, voltage values of $\Delta x_i$ and $\Delta y_i$ are reached. The values $x_i$ and $y_i$ are added to the respective output signals in respective analog adders 82 and 84. The voltages at the outputs of adders 82 and 84 are therefore step voltages starting at values $x_i$ and $y_i$ respectively. At time $t_{i+1}$ they reach the value $x_{i+1}$ and $y_{i+1}$ respectively. Comparators 86, 88 compare the respective voltage values with the respective outputs of D/A converters 62 and 64 and activate an electronic switching circuit 90, 92 to disconnect hold circuit 94, 96 as soon as the new values $x_{i+1}$ and $y_{i+1}$, respectively, are reached. The holding circuits hold the values $x_{i+1}$ and $y_{i+1}$ until such a time as new values are loaded into buffer storages 61, 63, 65, 67, 69, and 71.

Interpolated processing path signals $x_b$ and $y_b$ are available at the outputs of holding circuits 94 and 96.

A microprocessor also furnishes the values $\sin \phi$ and $\cos \phi$ signifying the direction of the normal to the processing path at each approximation point in digital form. These signals are converted into analog signals in D/A converters 98 and 100, respectively.

The block diagram of FIG. 1 also shows a closed loop (feedback) circuit 16 for automatic compensation of tolerances in the positioning of the workpiece and deviations of the predetermined processing path $x_b$, $y_b$, relative to the actual position of the gap to be welded. This feedback system requires a scanning of the upper surface of the workpiece so that the actual position of the gap to be welded may be determined. This scanning requires a measuring cycle which preceeds the actual processing cycle. Both the measuring and the processing cycle are initiated by the central control system of the apparatus.

The electron beam of the welder is used for the scanning process, generally with a reduced intensity. The density of electrons reflected by the upper surface of the workpiece is measured with the aid of an electrically insulated collector electrode 24 arranged in the welding chamber. If the electron beam is deflected over the top surface of the workpiece in the direction perpendicular to the gap, and the number of electrons reflected by the metallic upper surface of the workpiece and collected by electrode 24 is measured, this number will decrease sharply at the time at which the electron beam is completely or partially opposite the gap, since at that time the walls of the gap absorb most of the reflected electrons. The number of electrons reaching electrode 24 is measured as a voltage drop across a resistor 25. The voltage minimum across this resistor generated during movement of the beam perpendicular to the gap indicates the actual position of the gap to be welded. This is compared to the position specified by the coordinates of the predetermined processing path and an error or deviation signal $y_{Ki}$ is generated corresponding to the difference between the two values. This value is stored in digital form in storage 27 and constitutes a correction for each of the approximation points. Correct addressing of the storage and timing of the transfer of information therefrom is controlled by the processing path approximation generator.

The back and forth movement of the electron beam perpendicular to the processing path required in the measuring cycle is controlled by the signal $y_a$ generated in deflection signal generator 14 after coordinate rotation in circuit block 18.

In the processing cycle which follows the measuring cycle, switch 20 is switched to receive the output of oscillator 12. The correction values $y_{Ki}$ for each point are read out from storage 27 and converted into a corresponding analog signal by a D/A converter 28. The output of D/A converter 28 is applied to one input of an analog adder 29 whose second input receives the $y_p$ value from oscillator 12. The output of adder 29 is transferred through switch 20 to circuit block 18 where the coordinate rotation takes place. Thus the correction signals $y_K$ undergo rotation before being applied to the deflection amplifiers for the electron beam, as were deflection signal $y_a$ during the measuring cycle.

FIG. 4 shows a typical path of the most general type traced by the electron beam of the beam welder, and wherein $x_i$, $y_i$ are the cartesian coordinates of the respective points traced by the beam, while $x'$, $y'$ represent points on the modulation curve of a coordinate system rotated relative to the cartesian coordinate system. In a preferred version the $x'$, $y'$ coordinates are rotated so that the $y'$ coordinates are always normal to the instantaneous tangent of the processing path.

While the invention has been illustrated in preferred embodiments, it is not to be limited to the circuits and structures shown, since many variations thereof will be evident to one skilled in the art and are intended to be encompassed in the present invention as set forth in the following claims.

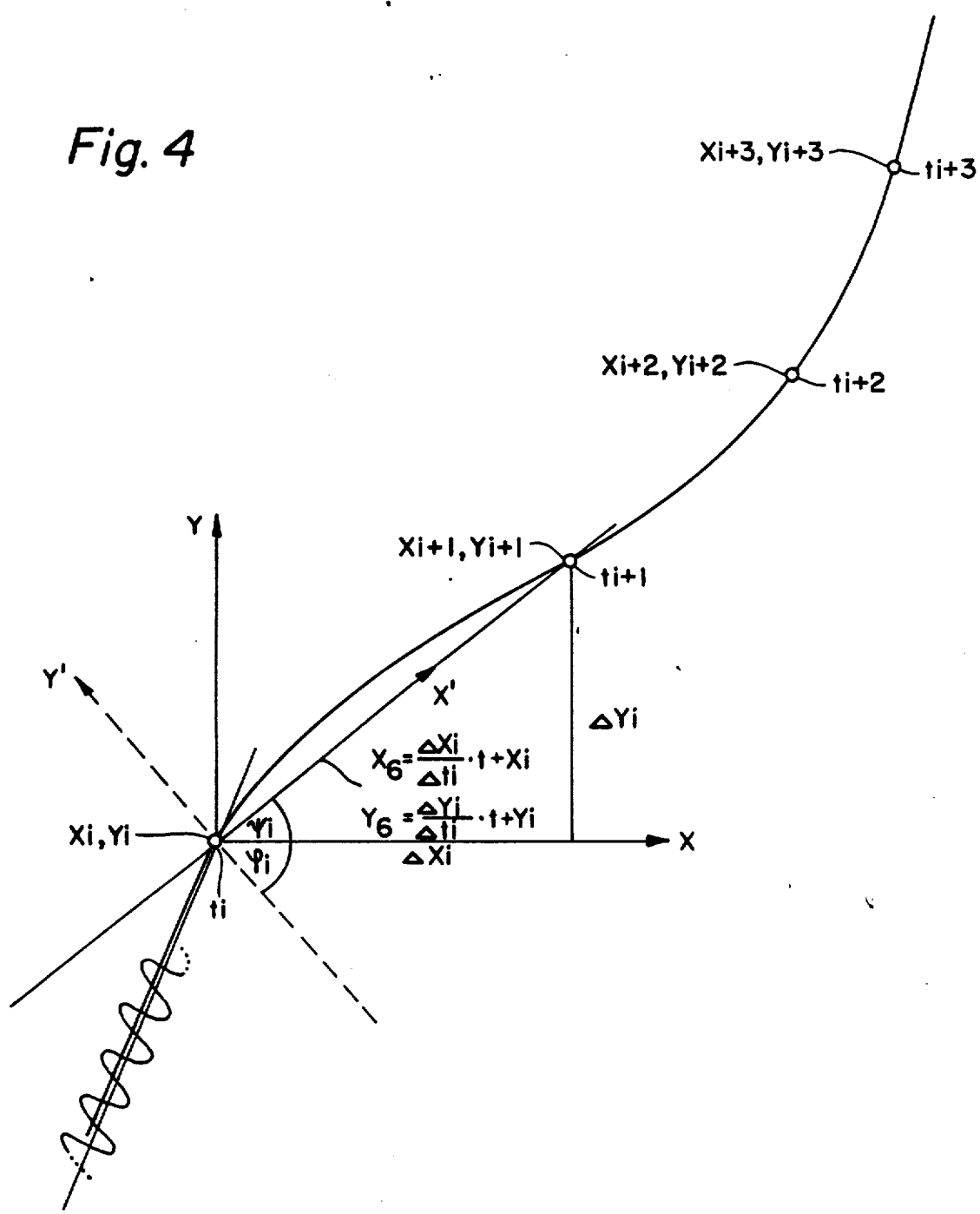

I claim:

1. Method for processing a workpiece by means of a focussed electron beam impinging on said workpiece along a predetermined processing path, and along a micromotion modulation path relative to said processing path, comprising the steps of approximating said processing path by a sequence of points at predetermined distances from another;

moving said electron beams between respective sequential ones of said points along respective connecting paths at respective preselected velocities;

furnishing a direction signal indicative of the direction from each of said points to the next subsequent one thereof; and changing the direction of said modulation path in accordance with said direction signal, whereby the ensuing micromotion of the electron beam substantially influences the structure of a resulting weld of the workpiece.

2. A method as set forth in claim 1, wherein said connecting paths are straight lines.

3. A method as set forth in claim 1, wherein each of said points has an x and y coordinate; further comprising the steps of:

computing the respective incremental time intervals required for said electron beam to move between said respective sequential ones of said points at said respective preselected velocities;

computing the rate of change, respectively, of said x and y coordinates between said respective sequential ones of said points; and moving said electron beam relative to said workpiece in accordance with the so-computed rates of change.

4. A method as set forth in claim 3, wherein said electron beam is moved continuously along each of said connecting paths.

5. A method as set forth in claim 3, wherein said electron beam is moved step-by-step along each of said connecting paths.

6. A method as set forth in claim 1, wherein said sequence of points approximating said processing path constitutes a sequence of processing points each having an x and y processing coordinate in a fixed coordinate system;

wherein said modulation path is approximated by a sequence of modulation points, each having an x and y modulation coordinate in said fixed coordinate system; and wherein said x and y modulation coordinates are rotated in accordance with said direction signal and additively superimposed on each of said processing points.

7. A method as set forth in claim 1, wherein said modulation path is a curve oscillating about said processing path.

8. A method as set forth in claim 6, further comprising the steps of:

generating a deviation signal indicative of the difference between the actual position of impingement of said electron beam on said workpiece and said predetermined processing path; and changing the position of imingement of said electron beam on said workpiece in accordance with said deviation signal.

9. A method as set forth in claim 9, wherein said processing of said workpiece is carried out in a processing cycle; and wherein said deviation signal is generated in a measuring cycle preceding said processing cycle.

10. A method as set forth in claim 9, wherein said step of generating said deviation signal comprises:

creating a mircromotion between said electron beam and said workpiece in a direction normal to said predetermined processing path;

collecting electrons reflected from said workpiece during said micromotion of said electron beam;

generating an actual position signal in response to a substantial change in the number of so-collected electrons; and computing said deviation signal as the difference between said actual position signal and the corresponding point of said processing path.

11. Apparatus for processing a workpiece by means of an electron beam impinging on said workpiece along a predetermined processing path, comprising input means for furnishing coordinates of a plurality of sequential points together approximating said predetermined processing path;

modulation signal generator means for furnishing modulation signals for said electron beam to additionally travel along a micromotion modulation path;

moving means for moving said electron beam between respective sequential ones of said points along respective connecting paths at respective preselected velocities and including deflection means for deflecting said electron beam in accordance with deflection input signals applied thereto;

interpolation means connected to said input means for furnishing a deflection signal corresponding to said plurality of sequential points and interpolation therebetween; and means interconnected between said interpolation means, said modulation signal generator means and said deflection means for adding said modulation signals to said deflection signals and applying the resultant sum signal to said deflection means, whereby the ensuing micromotion of the electron beam substantially influences the structure of a resulting weld of the workpiece.

12. Apparatus as set forth in claim 11, wherein said moving means comprises interpolation means for moving said electron beam step by step along said respective connecting paths.

13. Apparatus as set forth in claim 12, wherein said said input means further furnishes a plurality of digital coordinate difference values indicative of the difference between sequential ones of said coordinates, digital time difference values indicative of the time required for said electron beam to move along said respective connecting paths at said respective preselected velocities, and a plurality of inverse time difference values corresponding to the inverse of said digital time difference values; and wherein said interpolation means comprises first digital-/analog converter means having a reference input receiving said inverse time difference values, a digital input receiving said digital coordinate difference values and a first converter output furnishing a first converter output signal; and first integrator means connected to said first converter output for integrating said first converter output signal and furnishing a beam deflection signal corresponding to the so integrated first converter output signal.

14. Apparatus as set forth in claim 13, wherein said interpolation means further comprises second digital-/amplifier converter means connected to said input means for receiving digital coordinate values of the next subsequent one of said points and furnishing corresponding analog subsequent coordinate signals; and comparator means connected to said second digital-/analog converter means and said first integrator means for disconnecting said first integrator means from said first digital/analog converter means when said deflection signal is equal to said subsequent analog coordinate signal; and wherein said first integrator means comprises holding means for maintaining the then present deflection signal until reconnected to said first digital/analog converter means.

15. Apparatus as set forth in claim 11, wherein said interpolation means moves said electron beam continuously along said respective connecting paths.

16. Apparatus as set forth in claim 15, wherein said input means further furnishes digital coordinate difference values signifying the difference between coordinates of sequential ones of said points and digital time difference values signifying the time required to move along said respective connecting paths at said respective preselected velocities; and wherein said interpolation means comprises clock signal generator means connected to said input means for generating clock signals at a frequency corresponding to said time difference values; counting means connected to said clock signal generator means for counting said clock signals and furnishing a corresponding counting output signal; third, fourth, and fifth digital/analog converter means connected to said input means for furnishing analog signals corresponding, respectively, to the digital coordinate value of an initial point, the coordinate values of the next subsequent point, and said digital coordinate difference value; multiplier digital/analog converter means having a reference input connected to the output of said fifth digital/analog converter means, a digital input connected to the output of said counting means, and a multiplier output; summing means having a first input connected to the output of said multiplier digital/analog converter means, a second input connected to said third digital/analog converter means and a summing output furnishing a deflection signal for said electron beam.

17. Apparatus as set forth in claim 16, further comprising comparing means having a first input connected to the output of said fourth digital/analog converter means and a second input to said output of said summing means for furnishing a disconnect signal when the signals at said first and second inputs are equal;
holding circuit means furnishing said deflection signal; and
switch means having a control input connected to the output of said comparing means for connecting said holding circuit means to said summing means when closed and adapted to open upon receipt of said disconnect signal.

18. Apparatus as set forth in claim 11, wherein said input means further furnishes direction signals indicative of the direction of said connecting path to the next subsequent approximation point;
wherein said modulation signal generator means furnishes modulation signals in a fixed coordinate system; and
further comprising coordinate rotation means connected to said input means and said modulation generator means for rotating said modulation signals prior to application to said adding means.

19. Apparatus as set forth in claim 18, wherein said direction signals comprises a signal sin $\phi$ and a signal cos $\phi$, where $\phi$ is the angle between the then-present normal to the processing path and the x axis of said fixed coordinate system; and
wherein said coordinate rotation system rotates said modulation signals in accordance with the following equations:

$$x' = x_m \cos \phi - y_m \sin \phi$$

$$y' = x_m \sin \phi + y_m \cos \phi$$

Where $x_m$, $y_m$ are the modulation coordinates prior to rotation, and (x', y') are the coordinates after rotation.

20. Apparatus as set forth in claim 18 wherein said direction signals are the signals sin $\psi$ and cos $\psi$ where $\psi$ is the angle between the instantaneous tangent to said predetermined processing path and the x axis of said fixed coordinate system; and
wherein said coordinate rotation system rotates said modulation coordinates in accordance with the equations:

$$x' = -x_m \sin \psi + y_m \cos \psi$$

$$y' = x_m \cos \psi + y_m \sin \psi$$

where $x_m$, $y_m$ are the coordinates of said modulation signals prior to rotation.

21. Apparatus as set forth in claim 11, further comprising means for generating a deviation signal indicative of the difference between the actual position of impingement of said electron beam on said workpiece and said predetermined processing path; and
means for changing the position of impingement of said electron beam on said workpiece in accordance with said deviation signal.

22. Apparatus as set forth in claim 21, wherein said processing of said workpiece is carried out in a processing cycle; and
wherein said deviation signal is generated in a measuring cycle preceding said processing cycle.

23. Apparatus as set forth in claim 22, wherein said modulation signal generator means comprises means for generating processing modulation signals, means for generating measuring modulation signals, and modulation switch means for connecting said processing and measuring modulation signal generator means to said coordinate rotation means during said processing and measuring cycles, respectively;
wherein said measuring modulation signals extend only in the direction of the y axis of said fixed coordinate system; and
wherein said means for generating said deviation signal comprises means for collecting electrons reflected from said workpiece during said measuring cycle; means for generating an actual position signal in response to a substantial change in the number of so collected electrons; and means for computing said deviation signal as to difference between said actual position signal and the corresponding point of said processing path.

24. Apparatus as set forth in claim 23, wherein said means for changing the position of impingement of said electron beam in accordance with said deviation signal comprises means for adding said deviation signal to said processing modulation signals during said processing cycles.

25. Apparatus for processing a workpiece by means of an electron beam impinging on said workpiece along a predetermined processing path, comprising
input means for furnishing
coordinates of a plurality of sequential points together approximating said predetermined processing path, and a plurality of digital coordinate difference values indicative of the difference between sequential ones of said coordinates,
digital time difference values indicative of the time required for said electron beam to move along said respective connecting paths at said respective preselected velocities, and
a plurality of inverse time difference values corresponding to the inverse of said digital time difference values,
moving means for moving said electron beams between respective sequential ones of said points along respective connecting paths at respective preselected velocities, and including interpolation means for moving said electron beam step by step along said respective connecting paths, and including
first digital analog converter means having a reference input receiving said inverse time difference values,
a digital input receiving said digital coordinate difference values;
a first converter output furnishing a first converter output signal; and
first integrator means connected to said first converter output for integrating said first converter output signal, and furnishing a beam deflection signal corresponding to the so integrated first converter output signal.

* * * * *

UNITED STATES PATENT AND TRADEMARK OFFICE
CERTIFICATE OF CORRECTION

PATENT NO. : 4,595,819

DATED : June 17, 1986

INVENTOR(S) : Dieter Koch

It is certified that error appears in the above-identified patent and that said Letters Patent is hereby corrected as shown below:

In the drawing add Figure 4 to appear as shown on the attached Sheet 4 of 4.

"Sheet 1 of 3" should read -- Sheet 1 of 4 --.
"Sheet 2 of 3" should read -- Sheet 2 of 4 --.
"Sheet 3 of 3" should read -- Sheet 3 of 4 --.

Signed and Sealed this

Eleventh Day of November, 1986

Attest:

DONALD J. QUIGG

Attesting Officer

Commissioner of Patents and Trademarks